(12) United States Patent
Radamson

(10) Patent No.: US 8,344,845 B2
(45) Date of Patent: Jan. 1, 2013

(54) MULTILAYERED STRUCTURE

(76) Inventor: Henry H. Radamson, Marsta (SE)

( * ) Notice: Subject to any disclaimer, the term of this patent is extended or adjusted under 35 U.S.C. 154(b) by 21 days.

(21) Appl. No.: 13/140,938

(22) PCT Filed: Dec. 18, 2009

(86) PCT No.: PCT/SE2009/051458
§ 371 (c)(1),
(2), (4) Date: Jun. 20, 2011

(87) PCT Pub. No.: WO2010/071591
PCT Pub. Date: Jun. 24, 2010

(65) Prior Publication Data
US 2011/0254653 A1 Oct. 20, 2011

(30) Foreign Application Priority Data
Dec. 19, 2008 (SE) ........................ 0850160

(51) Int. Cl.
H01C 7/10 (2006.01)
(52) U.S. Cl. .............. 338/22 SD; 338/25; 338/22 R; 438/458; 257/513
(58) Field of Classification Search ............ 338/22 SD
See application file for complete search history.

(56) References Cited

U.S. PATENT DOCUMENTS

| 6,060,656 | A | 5/2000 | Dresselhaus et al. |
| 6,292,089 | B1 * | 9/2001 | Andersson ............... 338/25 |
| 7,348,259 | B2 * | 3/2008 | Cheng et al. ............ 438/458 |
| 7,425,751 | B2 * | 9/2008 | Balasubramanian et al. 257/513 |
| 7,838,392 | B2 * | 11/2010 | Langdo et al. .......... 438/459 |
| 2003/0165697 | A1 * | 9/2003 | Saitoh et al. ........... 428/446 |

FOREIGN PATENT DOCUMENTS

| EP | 0 812 023 A1 | 12/1997 |
| EP | 1 912 259 A1 | 4/2008 |

OTHER PUBLICATIONS

S G E Wissmar et al.: "SiGe quantum wells for uncooled long wavelength infra-red radiation (LWIR) sensors" ingar I J. Phys. : Conf. Ser. 100 042029, published online: Mar. 27, 2008, Cited in ISR.
International Search Report, dated Mar. 18, 2010, from corresponding PCT application.

* cited by examiner

Primary Examiner — Kyung Lee
(74) Attorney, Agent, or Firm — Young & Thompson

(57) ABSTRACT

A thermistor structure includes a multilayer structure of at least one quantum layer surrounded by barrier layers in a multilayer structure. The quantum layer includes Ge and may be in the form of either a quantum well or quantum dots. The barrier layer is a carbon-doped Si layer, and the thermistor is intended to provide a way to compensate for the strain in a multilayer IR-detector structure through carbon doping of the quantum layer and barrier layers.

19 Claims, 6 Drawing Sheets

MULTILAYERED STRUCTURE

TECHNICAL FIELD OF THE INVENTION

The present invention relates to detector structures, and in particular detector structures for the infra-red (IR) and terahertz regions.

BACKGROUND OF THE INVENTION

The infra-red (IR) radiation region in electromagnetic spectrum covers radiation with wavelengths between those of visible light and microwaves (750 nm respectively 1 mm). Detection of radiation in the IR region has many applications in both civilian and military purposes.

Infra-red detection methods are divided into the two categories of photonic and thermal working principals. The difference between these methods originates from their physical process and this implies different application areas. Photonic detectors have fast response times, in the order of $10^{-5}$ s, and operate when an excitation of charge carriers occurs through IR-absorption. The excitation of the charge carriers provides an electronic signal, which can be read at the output. Although the fast response time of photonic detectors makes them attractive they have to be cooled to cryogenic temperatures in order to reduce noise and obtain a useful signal. This makes them viable exclusively for high cost/high performance applications, where the cost of the detector is of secondary importance.

In contrast, thermal detectors follow the principle where the electrical conductivity of a sensing element changes due to heat generated through IR-absorption in a thermistor structure. Thermal detectors have a response time in the order of $10^{-3}$ s, and cannot compete with photonic devices for speed. On the other hand, they are cheap to manufacture, and they do not need to be cooled to cryogenic temperatures to function properly. The thermal detector can be a multilayer structure of SiGe/Si with a performance that is strongly dependent on the individual layers thicknesses. A bolometer designed structure, a device for measuring energy of incident electromagnetic radiation which is particularly accurate in the high-$\lambda$ of the IR spectra, is usually used when exploiting thermistor materials. The bolometer is manufactured through processing of e.g. multilayer structures, to form individual free-standing pixels. Typical thermistor materials are vanadium oxide and single- or multi-layers of (amorphous, poly-crystalline or single-crystalline) silicon or composite silicon-germanium based structures.

SUMMARY OF THE INVENTION

The objective of the present invention is to overcome at least some of the drawbacks of the prior art. This is achieved by devices and methods as defined in the independent claims.

A thermistor structure according to the invention comprises a multilayer structure of at least one quantum layer surrounded by barrier layers in a multilayer structure. The quantum layer comprises Ge and may be in the form of either a quantum well or quantum dots. The barrier layer is a carbon-doped Si layer, and the invention is intended to provide a way to compensate for the strain in a multilayer IR-detector structure through carbon doping of the quantum layer and barrier layers.

The invention is further related to increasing sensitivity in a multilayer IR-detector structure, and more particularly to increasing the signal to noise ratio in a multilayer IR-detector structure.

Embodiments of the invention are defined in the dependent claims. Other objects, advantages and novel features of the invention will become apparent from the following detailed description of examples of embodiments of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

The present invention relates to a multi-layer design for use as a thermal detector in the IR or terahertz region.

According to the present invention (see FIGS. 1, 2 and 3), a thermistor structure comprises at least one set of alternating layers, with a first layer A 60 comprising Si and a second layer B 50 comprising Ge, for use as a barrier and a quantum layer respectively, said layers forming a multilayer structure with a sequence $$A:B:\Delta:A$$

where $$\Delta = n \times \{A:B\}; n \geq 0$$

where the first layer is a $Si_{1-y}C_y$ layer with a composition given by $0.005 \leq y \leq 0.035$. The formula above means that the sequence may be repeated a desired number of times and the quantum layer is always sandwiched between barrier layers i.e. it always has barrier layers on both sides. In the formula above, n denotes the number of times the sequence (A:B) in the multilayer structure is repeated, and n can be any positive integer or zero. The multilayer structure is built onto a substrate 10, from which it can be released later in the process. The substrate 10 can be Si, Ge, $Al_2O_3$, or any other material suitable for epitaxial growth.

Figure 4:
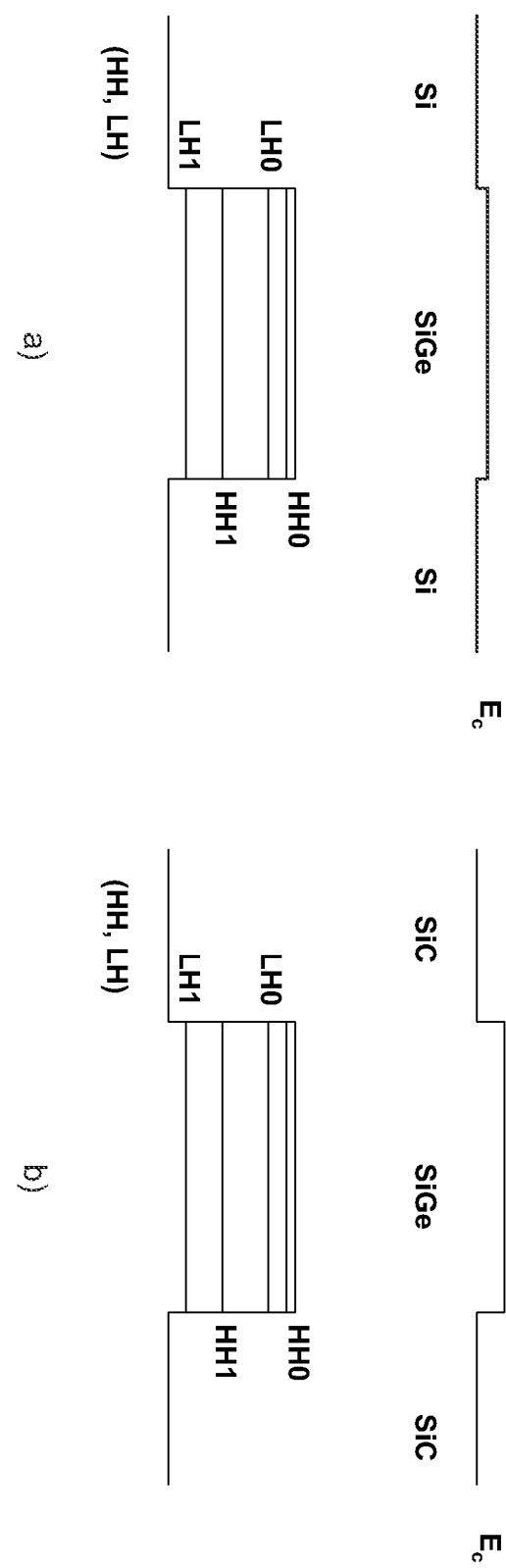
FIG. 4 shows schematically the band gap structures for a) Si/SiGe and b) $Si_{1-y}C_y/Si_{1-x}Ge_x$.
Figure 5:
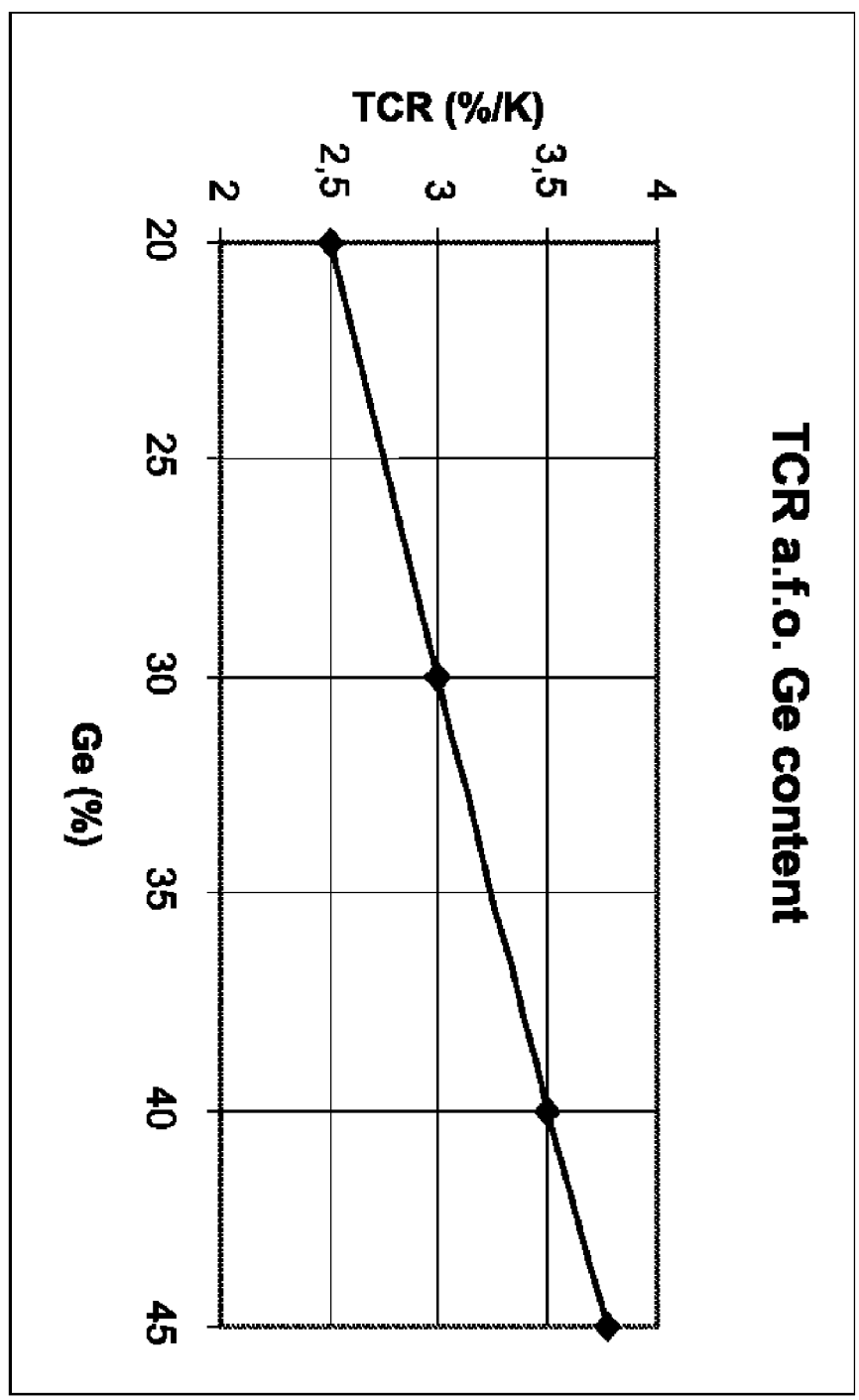
FIG. 5 shows how the temperature coefficient of resistance (TCR) depends on the Ge content in Si.

The Ge-containing layer can be in the form of Ge quantum dots arranged between two barrier layer surfaces, or in the form of a SiGe quantum well layer arranged between two barrier layer surfaces, or in the form of a carbon doped SiGe quantum well layer or quantum dots arranged between two barrier layer surfaces. A very important parameter to control in such layers is the strain. In particular, in silicon-germanium (quantum well) on silicon (barrier) in multi-layer structures, a high germanium content is desired in order to induce high strain amounts in a silicon-germanium arrangement of the atoms. The strain is a consequence of the substitutionally incorporated Ge atoms in the Si lattice. This strain modifies the band diagram, thus resulting in an increased valence band offset in the silicon-germanium, shown in FIG. 4. Another effect from the Ge incorporated in the Si lattice, also illustrated in FIG. 4, is the band splitting between the heavy hole (HH) and light hole (LH) bands, caused by the induced strain. The increased band offset of the silicon-germanium layers in the SiGe/Si multilayer structure is necessary to obtain high Temperature Coefficient of Resistance (TCR) values. The TCR value is a measure of the sensitivity of the structure, and a high TCR value means that the response from the structure is relatively strong, thus enabling detection of input signals of relatively lower intensity. In FIG. 5, it is shown how the concentration of Ge affects the TCR in SiGe. In the region shown in the figure, between 20 atomic percent and 45 atomic percent of Ge, the TCR increases linearly with the Ge content.

However, even though the strain locally increases the efficiency of the structure since the TCR value is increased, the total strain in the multilayer structure gives rise to an increased noise level, decreasing the efficiency of the structure. The nature of detector noise is related to Johnson-, generation/recombination- and 1/f-noise. In the detector structure, Johnson noise is obtained from the noise band width and from the total resistance over the structure. Johnson noise is not due to the applied bias voltage or bias current, as it is for 1/f noise and generation/recombination noise. In the latter noise type, the generation rate usually decreases when the activation energy increases.

The main source of 1/f noise is defects and interfacial roughness due to strain relaxation. A high quality epitaxial layer is a key point for a low noise in the detectors. The present invention offers a way to stress-compensate the structure by introducing carbon doping to the Si barrier layer. By mixing small amounts of carbon in the silicon lattice, between 0.5%-3.6%, the strain in the Si barrier layer can be controlled to counteract with the strain in the SiGe quantum well layer, thus resulting in a globally relaxed multi layer structure. The amount of carbon in the barrier layer is able to compensate for 10 times the amount of Ge in the quantum well layer. Thus, a concentration of approximately 30% to 35% of Ge in the quantum well layer can be compensated for by carbon doping the barrier layer. This enables the formation of a thermistor quantum well structure with a high band offset, thus having a high TCR-coefficient, and at the same time offers a relaxed structure where the strain in the SiGe layer is neutralized by the counteracting strain in the carbon doped Si barrier layer, resulting in a highly efficient thermistor having a low noise level and therefore a high sensitivity and a large signal to noise ratio.

Figure 1:
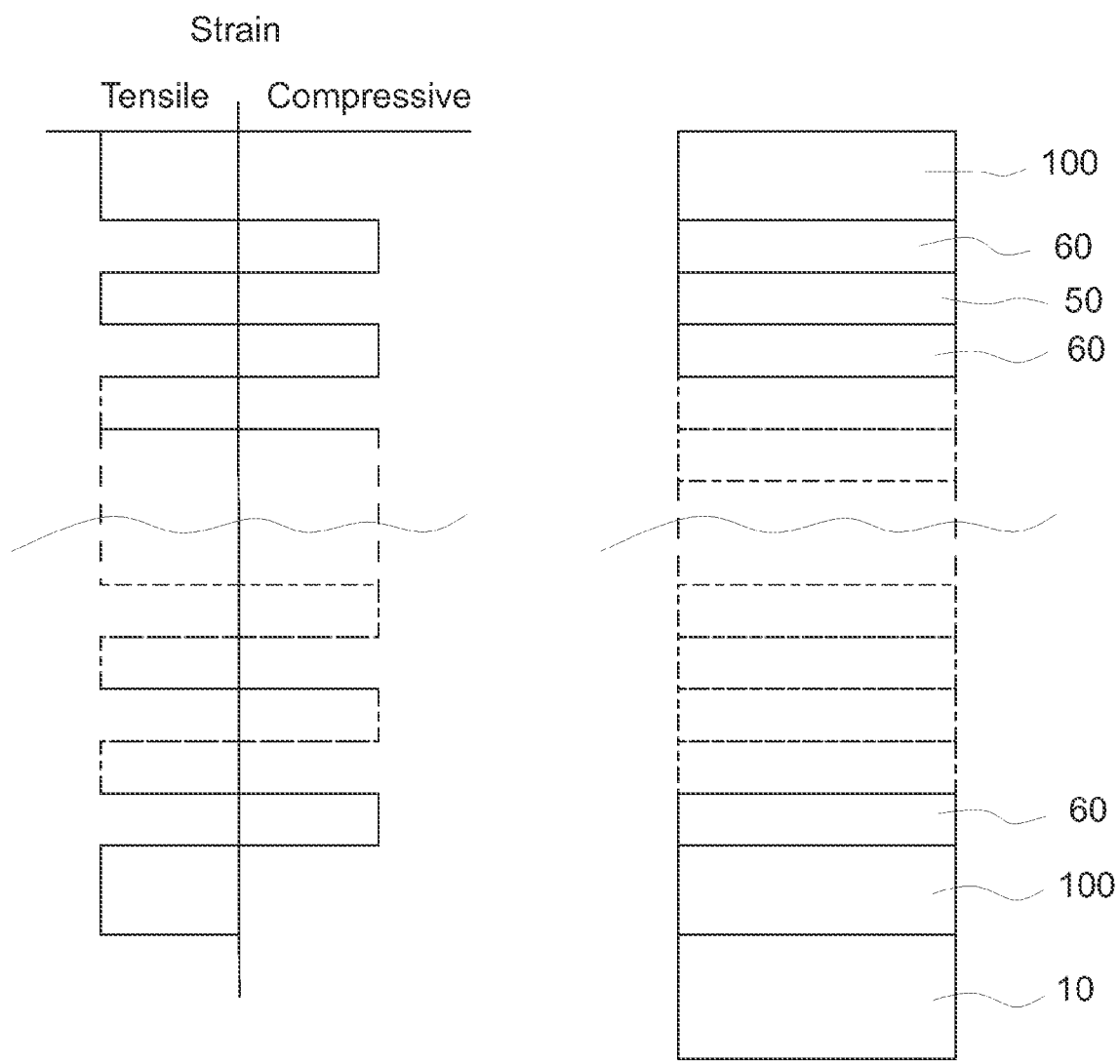
FIG. 1 illustrates the strain distribution in a multilayer structure with boron-doped contacts and barrier layers of $Si_{1-y}C_y$, and quantum well layers of $Si_{1-x}Ge_x$.
Figure 2:
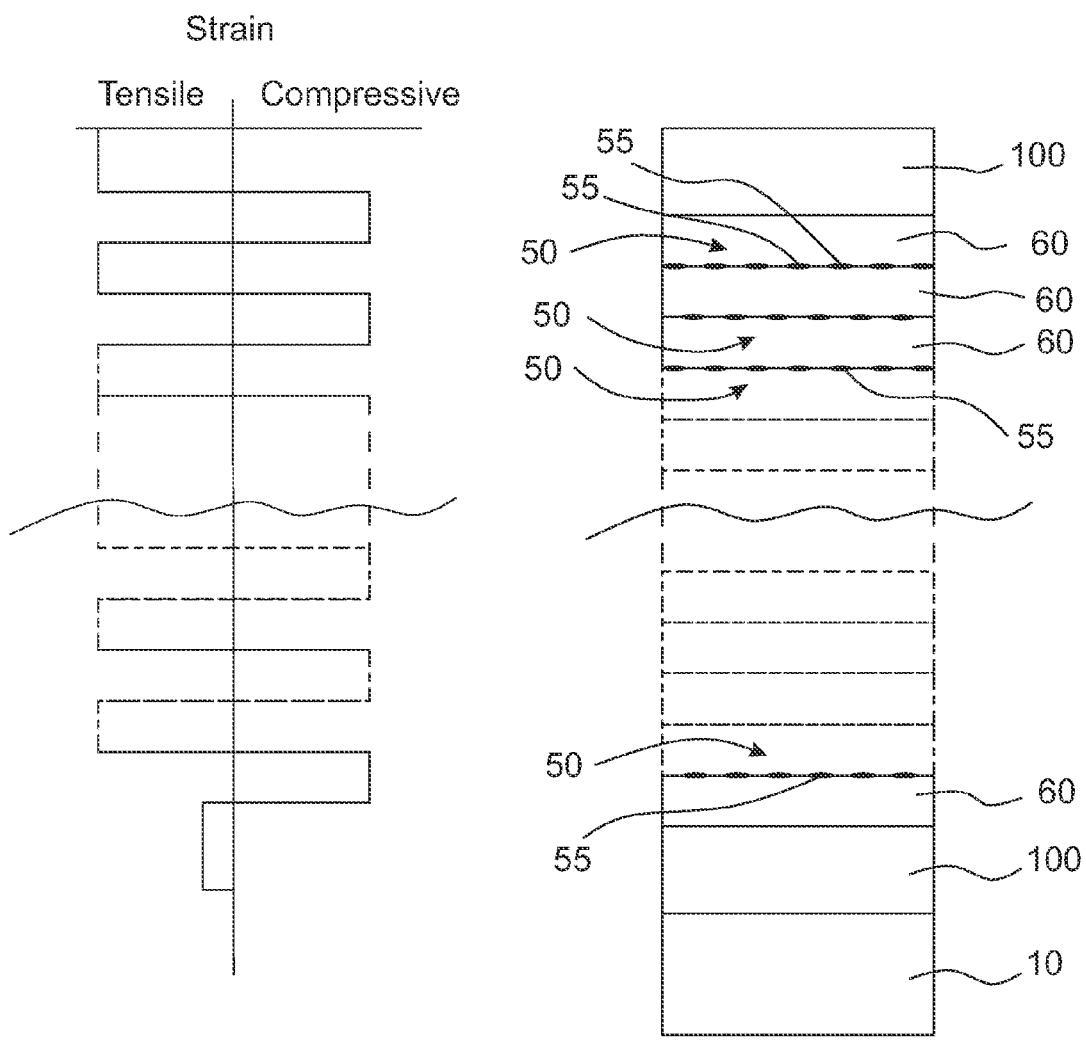
FIG. 2 illustrates the strain distribution in a multilayer structure with boron-doped contacts and barrier layers of $Si_{1-y}C_y$, and quantum well layers of Ge quantum dots.
Figure 3:
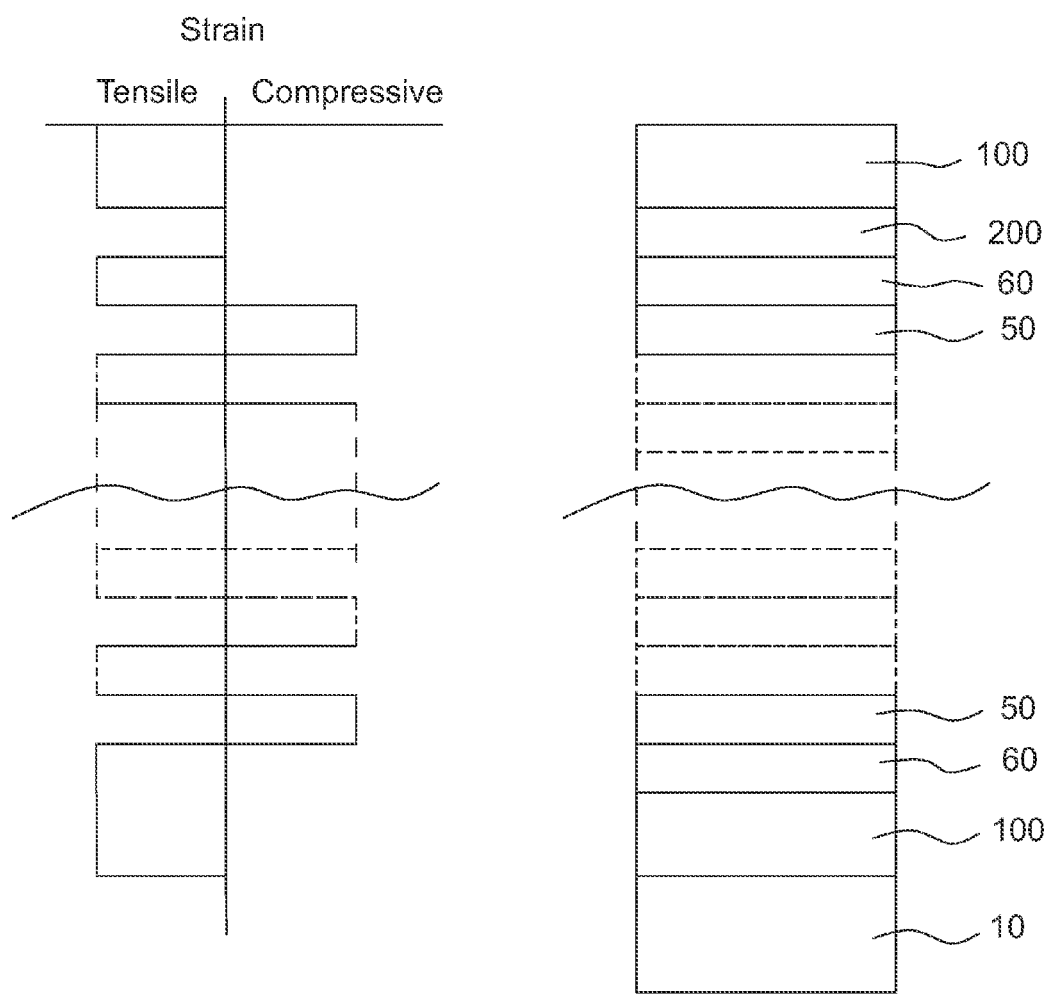
FIG. 3 illustrates the strain distribution in a multilayer structure comprising a silicon layer to prevent auto-doping from the boron-doped contact layer.

FIGS. 1, 2 and 3 illustrates multilayered structures that are strain compensated as proposed by the present invention. The strain diagram on the left side of the figures shows the strain distribution throughout the structure, and how it is compensated for layer by layer, thus globally resulting in a relaxed structure.

In another embodiment of the present invention, the SiGe quantum well layer comprises Sn, having a composition of $Si_{1-x-z}Ge_xSn_z$ where $0.20 \leq x \leq 1.00$, and $0 \leq z \leq 0.2$, preferably $0 \leq z \leq 0.05$, and more preferably $0 \leq z \leq 0.02$. Thus the content of Sn can actually be zero (when z=0). Introducing tin in the SiGe quantum well layer further increases the strain, thus further increases the TCR-value. By a proper relaxation in the multilayer structure using the carbon doped Si barrier layer, the result is a thermistor exhibiting even higher sensitivity, yet maintaining the low noise level due to the globally relaxed multilayer structure.

The composition of the thermistor structure can be given by $Si_{1-x-z}Ge_xSn_z$ where x is given by $0.20 \leq x \leq 1$, more preferably $0.50 \leq x \leq 1$, and most preferably $0.50 \leq x \leq 0.80$, and z is given by $0 \leq z \leq 0.2$, preferably $0 \leq z \leq 0.05$, and more preferably $0 \leq z \leq 0.02$. The $Si_{1-y}C_y$ layer can have a composition given by $0.005 \leq y \leq 0.035$, more preferably $0.010 \leq y \leq 0.035$, even more preferably $0.015 \leq y \leq 0.035$, even more preferably $0.020 \leq y \leq 0.035$, even more preferably $0.025 \leq y \leq 0.035$, and most preferably $0.030 \leq y \leq 0.035$.

In another embodiment of the present invention, the $Si_{1-x-z}Ge_xSn_z$-layer comprised in the thermistor structure is doped with carbon. Carbon incorporation within the quantum well layer, in a concentration of $1 \times 10^{-16}$-$1 \times 10^{21}$ cm$^{-3}$, more preferably in a concentration $1 \times 10^{17}$-$1 \times 10^{21}$ cm$^{-3}$, even more preferably in a concentration $1 \times 10^{18}$-$1 \times 10^{21}$ cm$^{-3}$, but most preferably in a concentration $1 \times 10^{20}$-$1 \times 10^{21}$ cm$^{-3}$, strongly increases the thermal stability in the layer. Thus, a carbon doped $Si_{1-x-z}Ge_xSn_z$ in a $Si_{1-x-z}Ge_xSn_z/Si_{1-y}C_y$ multilayer structure, will exhibit a high TCR-value, will be globally relaxed in terms of strain, and be thermally stable up to high temperatures.

In another embodiment of the present invention, the $Si_{1-x-z}Ge_xSn_z$ layer and the $Si_{1-y}C_y$ layer are monocrystalline layers. That means that the layers do not have grain boundaries since the complete layer is one single grain. It is often desired to have monocrystalline materials in many physical and in particular electronic applications, since grain boundaries can play a significant and sometimes unpredictable role in the final performance of the application.

Another element which induces tensile strain in silicon is boron. The small size of boron atoms compared to silicon atoms causes a contraction in silicon matrix when the boron is substitutionally incorporated. The contraction in the silicon contact can be used to further compensate the stress in the multilayer structure. Thus, both the barrier layers in the multilayer structure and the contacts surrounding the multilayer structure can be used to compensate for the induced stress in the doped SiGe quantum well layer. In general, a certain concentration of carbon in the Si barrier layer, is able to compensate for ten times that concentration of Ge in the Si quantum well layer. Thus, the proportion of Ge to C in a Si lattice [1] should be in the order of 1:10. This means a $Si_{0.98}C_{0.02}$ layer induces a strain which substantially opposes the strain induced by a $Si_{0.8}Ge_{0.2}$ layer. Recent reports have demonstrated that high quality $Si_{1-y}C_y$ layers with carbon concentrations up to y=0.036 can be grown [2]. That means that strain induced be up to 30%-35% Ge in the quantum well layer can be compensated for by carbon doping of the barrier layer. Using the strain-compensated $Si_{1-x-z}Ge_xSn_z/Si_{1-y}C_y$ layers as thermistor material allows the growth of multilayers with low defect density. However, if the quantum well layer is doped with Ge up to a level exceeding the limit of approximately 35% which can be compensated for by the carbon doped barrier layer, then the silicon contact layers can be doped with boron to compensate for the amount of Ge in the quantum well layer that exceeds 35%, thus resulting in a globally relaxed thermistor structure.

In one embodiment of the present invention, a first layer of boron doped Si covers a first side of the multilayer structure, and a second layer of boron doped Si covers a second side of the multilayer structure. This is illustrated in FIGS. 1, 2 and 3. The boron concentration in the Si layers is $\geq 1 \times 10^{18}$ cm$^{-3}$, more preferably the boron concentration is $\geq 1 \times 10^{19}$ cm$^{-3}$, and most preferably the boron concentration is $\geq 1 \times 10^{20}$ cm$^{-3}$ and $\leq 1 \times 10^{21}$ cm$^{-3}$. The more boron that is incorporated in the Si lattice, the higher is the conductivity of the Si, up to a concentration of $\geq 1 \times 10^{21}$ cm$^{-3}$, at which level more boron cannot be substitutionally accepted by Si. The high conductivity of the boron doped Si contact layer is needed in order for the contact layer to exhibit ohmic contact behaviour. Boron doped silicon layers are integrated in many device structures as ohmic small contact layers. A design comprising highly boron doped Si can thus be used as both a contact and a strain compensating layer for a $Si_{1-x-z}Ge_xSn_z/Si_{1-y}C_y$ multi-layer structure. One important integration aspect of such highly boron-doped silicon layers is avoiding of auto-doping or thermal diffusion of boron atoms during the epitaxial growth of $Si_{1-x-z}Ge_xSn_z/Si_{1-y}C_y$ multi-layers.

In one embodiment illustrated in FIG. 2 of the present invention, the second layer is a Ge quantum dot layer with composition $Si_{1-x-z}Ge_xSn_z$ where x=1 and z=0, positioned between two layers of said $Si_{1-y}C_y$ barrier layer, where a sequence of $Si_{1-y}C_y$/Ge quantum dots/$Si_{1-y}C_y$ layer forms one period of a multilayer structure, which period is repeatable a desired number of times. The quantum dots in the quantum dot layer are distributed between two barrier layers in an ordered matrix pattern. The quantum dots are displaced in relation to each other from one layer to another, to avoid a build up of bumps in the final multilayer structure.

It is also seen in all the figures illustrating a multilayered structure according to the invention, FIGS. 1, 2 and 3 and 6, that the thickness of the top and bottom $Si_{1-y}C_y$ layers are of essentially the same thickness as the intermediate $Si_{1-y}C_y$ layers.

In another embodiment of the present invention, the quantum dot layer comprises Si and/or Sn in addition to Ge, thus have a composition where x<1 and/or z>0 positioned between two layers of said $Si_{1-y}C_y$ barrier layer, where a sequence of $Si_{1-y}C_y$/SiGe or GeSn or SiGeSn quantum dots/$Si_{1-y}C_y$ layer forms one period of a multilayer structure, which period is repeatable a desired number of times. Si may be incorporated into the Ge during deposition, or by diffusion from surrounding layers.

For the growth of Ge quantum dots on Si surface the growth temperature becomes very important since a diffusion of Si atoms into quantum dots can occur. This diffusion of Si atoms results in an intermixing which reduces the strain energy of the system. As a result, the growth dynamics of dots is modified causing a larger dot size. The intermixing of Si into Ge in an uncontrolled way, may result in Ge or SiGe alloys with high defect density due to strain relaxation. Quantum dots having these defects cannot be implemented in sensor structures since they generate high noise levels. It has been shown that applying a low growth temperature or depositing a very thin layer, about two monolayers, of carbon on the barrier layer prior to the growth of quantum dots suppresses the diffusion of Si into Ge. However, the $Si_{1-y}C_y$ barrier layer of the invention can account for supplying carbon to the interface between said barrier layer and the quantum well layer, Ge or SiGe alloys, thus effectively substantially reducing the diffusion of Si into the quantum dots. The new design then consists of carbon doped Ge dots/$Si_{1-y}C_y$ multilayer structures.

The quantum dots 55 can have diameters in a range of 50-150 nm, more preferably in a range of 70-130 nm, and most preferably in a range of 90-110 nm. Further, the quantum dots can have a height in the range of 4-12 nm, more preferably a height of 5-10 nm, and most preferably a height of 5-8 nm.

In one embodiment of the present invention, the multilayer structure comprising quantum dots is contacted on a first side and a second side by a boron doped Si layer that covers both ends of the structure illustrated in FIG. 2. The boron concentration in the boron doped Si layer is $\geq 1 \times 10^{18}$ cm$^{-3}$, more preferably the boron concentration is $\geq 1 \times 10^{19}$ cm$^{-3}$, and most preferably the boron concentration is $\geq 1 \times 10^{20}$ cm$^{-3}$ and $\leq 1 \times 10^{21}$ cm$^{-3}$.

Referring to FIG. 3, in the case when the contact material is boron doped silicon, the boron within the boron doped silicon contact layer 100 may diffuse during high-temperature conditions, or auto-doping may occur during epitaxial growth and incorporate also the adjacent layers. This will strongly degrade the performance of the thermistor structure. Thus, in one embodiment of the present invention illustrated in FIG. 3, a silicon layer 200 is arranged in between the boron doped silicon contact layer 100 and the first barrier layer 60. This silicon layer 200 efficiently prevents auto-doping or thermal diffusion of boron into the thermistor structure. This way of preventing auto-doping may be applied to the contacts at both sides of the structure, and in all cases when boron-doped silicon contact layers 100 are applied to a thermistor structure.

Figure 6:
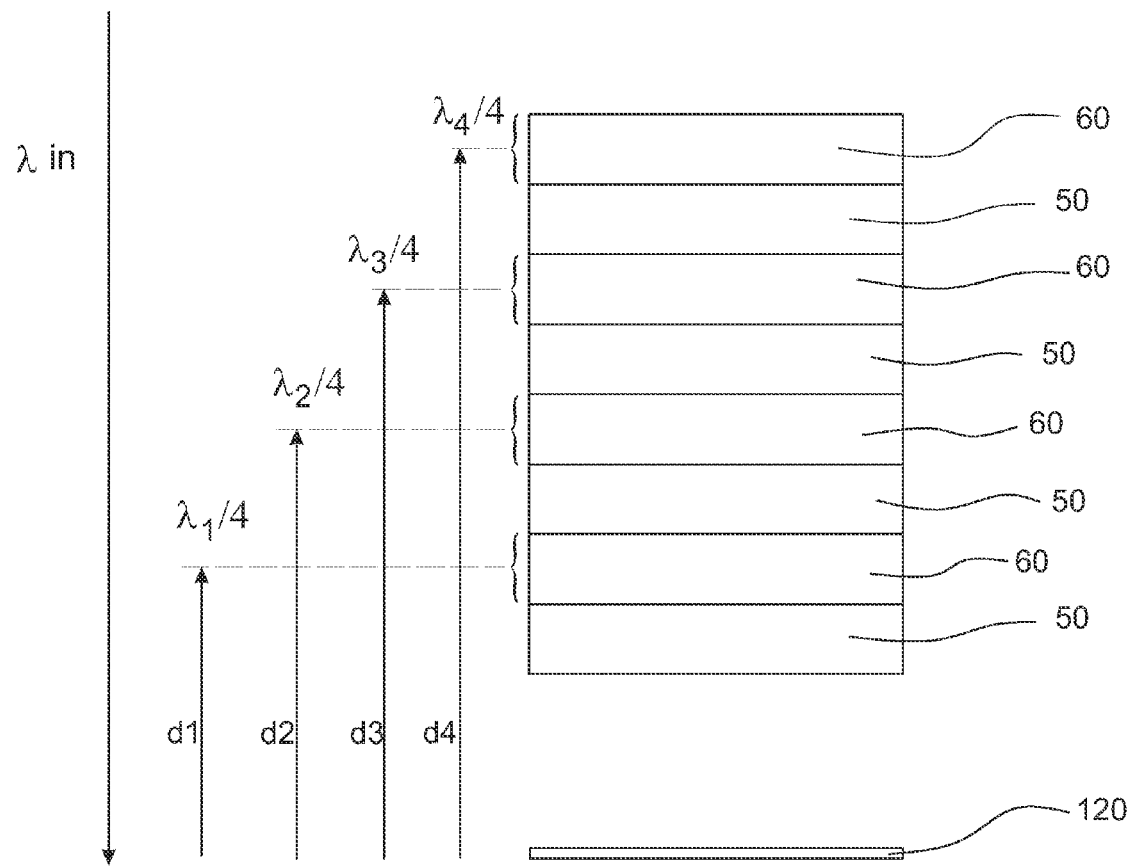
FIG. 6 shows a thermistor and illustrates the absorption for different wavelengths and that the absorption peaks at $\lambda/4$.

FIG. 6 shows a complete thermistor structure emphasizing the absorption layers as a function of different wavelengths. The thermistor comprises a multilayer structure and a reflector 120, i.e. a reflecting mirror. Each barrier layer 60 containing carbon is positioned a distance of one quarter of a wavelength away from the reflector 120 in order to maximize absorption intensity for each desired wavelength to be detected. Thus, the thermistor structure may be optimized for absorption of several wavelengths, depending on the number of layers in the multilayer structure. That means that in FIG. 6, $\lambda_1/4$ equals $d_1$, $\lambda_2/4$ equals $d_2$, $\lambda_3/4$ equals $d_3$, and $\lambda_4/4$ equals $d_4$. The illustration in the figure comprises 4 distances matching four different wavelengths. However, this is only for illustrative purposes, and not meant as a restriction, and a thermistor structure can be optimized to receive more as well as fewer different wavelengths.

In another embodiment of the present invention, a method of fabricating a thermistor structure comprising at least one set of alternating layers, a first layer A with a composition $Si_{1-y}C_y$ and a second layer B with a composition $Si_{1-x-z}Ge_xSn_z$, for use as a barrier and a quantum layer respectively, said layers in the multilayer structure being in the sequence $$A:B:\Delta:A$$

where $$\Delta = n \times (A:B); n \geq 0$$

and $$0.20 \leq x \leq 1.00$$

$$0.005 \leq y \leq 0.035$$

$$0 \leq z \leq 0.2$$

comprising the steps of;
providing a substrate
placing the substrate in a deposition chamber
evacuate the deposition chamber to a pressure <10$^{-10}$ Torr
introducing gases for deposition through gas inlets into the vacuum chamber
deposit a desired number of layers according to A:B:Δ:A using a deposition method
purge the chamber
ventilate the chamber The method may further comprise the step of heating the substrate.

It is to be understood by a person skilled in the art that combinations of the above disclosed embodiments are also possible.

While the invention has been described in connection with what is presently considered to be the most practical and preferred embodiments, it is to be understood that the invention is not to be limited to the disclosed embodiments. On the contrary, is intended to cover various modifications and equivalent arrangements within the scope of the appended claims.

REFERENCES

[1] C. W. Liu, Y. D. Tseng, and Y. S. Huang, Applied Physics Letters, vol 75 (1999) 2271.
[2] Mathias Bauer, Vladimir Machkaoutsan, and Chantal Arena, Semicond. Sci. Technol. 22 (2006) 183.

The invention claimed is:

1. A thermistor structure comprising at least one multilayer structure comprising a set of alternating layers, a first layer A (60) comprising Si and a second layer B (50) comprising Ge, for use as a barrier layer and a quantum layer respectively, said layers in the multilayer structure being in the sequence $$A:B:\Delta:A$$

where $$A = n \times (A:B); n \geq 0$$

where the first layer A (60) is a $Si_{1-y}C_y$ layer where the composition of the $Si_{1-y}C_y$ layer is given by $0.005 \leq y \leq 0.035$, characterized in that
the second layer B (50) is a $Si_{1-x-z}Ge_xSn_z$ layer with the composition given by $$0.20 \leq x < 1.00$$

$$0 < z \leq 0.2.$$

2. The thermistor structure according to claim 1, wherein the composition of the first layer A (60), which is a $Si_{1-y}C_y$ layer, is given by $$0.020 \leq y \leq 0.035.$$

3. The thermistor structure according to claim 2, wherein the composition of the layer is given by $$0.50 \leq x < 1.$$

4. The thermistor structure according to claim 1, wherein the composition of the layer is given by $$0.50 \leq x \leq 1.$$

5. The thermistor structure according to claim 1, wherein the $Si_{1-x-z}Ge_xSn_z$ is doped with carbon in a concentration $1 \times 10^{16} - 1 \times 10^{21}$ cm$^{-3}$.

6. The thermistor structure according to claim 5, wherein the doping concentration of carbon is $1 \times 10^{20} - 1 \times 10^{21}$.

7. The thermistor structure according to claim 1, wherein the $Si_{1-x-z}Ge_xSn_z$ layer and the $Si_{1-y}C_y$ layer are monocrystalline layers.

8. The thermistor structure according to claim 1, wherein a first layer of boron doped Si covers a first side of the multilayer structure and a second layer of boron doped Si covers a second side of the multi layer structure, said first and second boron doped Si-layers having a boron concentration of $\geq 1 \times 10^{18}$ cm$^{-3}$.

9. The thermistor structure according to claim 8, wherein the boron concentration is $\geq 1 \times 10^{19}$ cm$^{-3}$ and $< 1 \times 10^{21}$ cm$^{-3}$.

10. The thermistor structure according to claim 9, wherein an Si layer is arranged between the first layer of boron doped Si and its most adjacent barrier layer, and another Si layer is arranged between the second layer of boron doped Si and its most adjacent barrier layer.

11. The thermistor structure according to claim 8, wherein an Si layer is arranged between the first layer of boron doped Si and its most adjacent barrier layer, and another Si layer is arranged between the second layer of boron doped Si and its most adjacent barrier layer.

12. The thermistor structure according to claim 1, wherein the second layer B (50) is a quantum dot layer comprising $Si_{1-x-z}Ge_xSn_z$ quantum dots, with x=1 and z=0.

13. The thermistor structure according to claim 12, wherein the quantum dots have a diameter of 50 nm-150 nm and a height of 4-12 nm.

14. The thermistor structure according to claim 12, wherein the quantum dots have a diameter of 90 nm-110 nm and a height of 5-8 nm.

15. The thermistor structure according to claim 1, wherein the second layer B (50) is a quantum dot layer comprising $Si_{1-x-z}Ge_xSn_z$ quantum dots, with x<1 and/or z>0.

16. The thermistor structure according to claim 15, wherein the quantum dots have a diameter of 50 nm-150 nm and a height of 4-12 nm.

17. The thermistor structure according to claim 15, wherein the quantum dots have a diameter of 90 nm-110 nm and a height of 5-8 nm.

18. A method of fabricating a thermistor structure comprising at least one set of alternating layers, a first layer A with a composition $Si_{1-y}C_y$ and a second layer B (50) with a composition $Si_{1-x-z}Ge_xSn_z$, for use as a barrier layer and a quantum well layer respectively, said layers in the multilayer structure being in the sequence $$A:B:\Delta:A$$

where $$\Delta = n \times (A:B); n \geq 0$$

and $$0.20 \leq x < 1.00$$

$$0.005 \leq y \leq 0.035$$

$$0 < z \leq 0.2$$

comprising the steps of:
  providing a substrate
  placing the substrate in a deposition chamber
  evacuate the deposition chamber to a pressure <$10^{-10}$ Torr
  introducing gases for deposition through gas inlets into the deposition chamber
  deposit a desired number of layers according to A:B:Δ:A using a deposition method
  evacuate the chamber
  ventilate the chamber.

19. The method according to claim 18, further comprising the step of heating the substrate during deposition.

* * * * *